United States Patent [19]

Killingsworth

[11] Patent Number: 4,500,779
[45] Date of Patent: Feb. 19, 1985

[54] METER ENCODING REGISTER HAVING IMPROVED ZEROING MECHANISM

[75] Inventor: Emmett D. Killingsworth, Raleigh, N.C.

[73] Assignee: Westinghouse Electric Corp., Pittsburgh, Pa.

[21] Appl. No.: 353,139

[22] Filed: Mar. 1, 1982

[51] Int. Cl.³ .............. G01D 5/34; G06C 15/42
[52] U.S. Cl. .................... 250/231 SE; 235/144 DM; 340/870.02
[58] Field of Search ............ 250/231 SE; 340/347 P, 340/870.02, 870.03, 870.04; 324/74; 235/144 HC, 144 DM, 144 S, 144 SP

[56] References Cited

U.S. PATENT DOCUMENTS

| | | |
|---|---|---|
| 1,019,996 | 3/1912 | Siegfried ............... 235/144 HC |
| 1,054,363 | 2/1913 | Newell et al. ............ 235/144 DM |
| 3,598,970 | 8/1971 | Mizutani et al. ......... 235/144 HC X |
| 3,725,902 | 3/1973 | Finnegan . |
| 4,072,267 | 2/1978 | Benbow ................. 235/144 SP X |
| 4,102,028 | 7/1978 | Currie . |
| 4,184,071 | 1/1980 | Fryer et al. . |
| 4,224,514 | 9/1980 | Weber . |
| 4,285,595 | 8/1981 | Fryer et al. . |
| 4,342,908 | 8/1982 | Henningsen et al. ..... 250/231 SE X |

Primary Examiner—Edward P. Westin
Attorney, Agent, or Firm—William D. Lanyi

[57] ABSTRACT

A multiple-shaft meter encoding register having each shaft clutched to the gear train includes a cam attached to each shaft in a predetermined angular relationship thereto. An alignment tool is removably positioned in a predetermined position with respect to the frame of the register, such that interdial alignment can be accomplished by individually rotating each shaft until it respective cam engages a surface of the alignment tool.

25 Claims, 5 Drawing Figures

METER ENCODING REGISTER HAVING IMPROVED ZEROING MECHANISM

BACKGROUND OF THE INVENTION

The encoding of meter readings for use in remote reading telemetry systems is well known. In a utility meter, registers provide a read-out of the total consumption of the measured quantity, such as kilowatthours of electrical energy in a watthour meter, by converting the sum of rotations of a meter shaft into calibrated dial readings. Watthour meter registers are typically provided with four or five dials with each dial having an associated pointer shaft, which are dirven by a gear train system from the rotating meter movement. The five dials, for example, have readings in units, tens, hundreds, thousands, and ten thousands of the quantity to be measured, for example, kilowatt-hours. The register has a predetermined ratio constant which is related to the consumption of the quantity to be measured and the rate of rotation of the metering movement produced by thhe consumption of one unit of the quantity to be measured. In an encoding register, the angular position of each of the dial pointer shafts is converted, or encoded, into an electrical binary or digital signal. In remote utility meter reading systems, encoding at the meter permits the electrical signal representation to be compared to the register dial reading at the meter site.

In U.S. Pat. No. 4,037,219 issued July 19, 1977 to Arthur Lewis and assigned to the assignee of this invention, there is disclosed and claimed an optoelectronic meter register encoder wherein a notched pattern disk, or code wheel, is mounted to each of a plurality of pointer shafts. The code wheels actuate photosensitive pick-ups, or photocells, to produce a multiple-bit binary code representation of the angular position of each pointer shaft. In accordance with the known construction of meter registers, the pointer shafts are interconnected by gearing so as to have a predetermined ratio such as a ratio of 1 to 10. In a five dial decade register, the units dial will rotate 10,000 times for a 1/10 incremental rotation of the ten-thousands dial. The thousands, hundreds, and tens dials will be proportionally rotated along with the movement of the lowest and highest order dials.

In the manufacture and maintenance of meter encoding register, it is necessary to precisely establish and maintain the position of each code wheel relative to each pointer shaft with which it is associated. The code wheels are assembled to the shafts, which are then assembled into the register gear train system. Finally the pointers are aligned on the ends of the pointer shafts with respect to the position of the code wheels and the dial indicating position of the pointer.

During manufacture it is necessary to test and adjust the code wheels so that they produce the appropriate electronic coded signal output for indicating the dial position of the shaft and pointer. Although the pointer may be shiftable on the pointer shaft, it is usually desirable to fix the position of the pointer on the shaft so that thereafter no readjusting of the code pattern occurs relative to the shaft and pointer.

Following the testing operation during the manufacturing process, it is necessary to reestablish electrical and mechanical interdial alignment. In some prior art registers, this was accomplished by permanently fixing the alignment at the time of manufacture. However, by permanently fixing the alignment it was also difficult if not impossible to reset the register reading in the field. A major improvement in this situation was achieved throuugh the use of clutch mechanisms on the register shafts, as taught by U.S. Pat. No. 4,072,267, issued Feb. 7, 1978 to Eugene C. Benbow and assigned to the assignee of this invention. Through the use of shaft clutches, each shaft could be independently adjusted and aligned to any desired level of accuracy.

In prior art designs incorporating clutches on the register shafts, resetting of the register to zero was accomplished by reading the shaft position electrically while adjusting the shaft angular position. That is, the electrical signal output of the register encoder was monitored during angular adjustment of each shaft. Since the electrical reading of registers incorporating the teachings of the aforementioned U.S. patents only changed every 18 degrees of shaft rotation and interdial alignment permitted a maximum of 9 degrees of alignment error, problems frequently developed in the alignment procedure. This procedure required the operator to set the dial to a transition point between two electrical readings, such that gear backlash on the register would allow the electrical reading to oscillate between the two readings on either side of the transition point. Since gear backlash was generally less than a few degrees, this procedure permitted alignment well within the 9 degree maximum error.

Although the aforementioned procedure produced satisfactory results, it was impossible to test the alignment on a finished register without going through the entire alignment procedure again. Thus, the skill of the operator was paramount to the success of the interdial alignment operation. Furthermore, the alignment procedure was time consuming, since the operator had to allow a significant period of time between electrical readings to allow the test apparatus to "settle". The alignment procedure was therefore a lengthy process which increased manufacturing cost.

The present invention is directed to the aforementioned difficulties and disadvantages in manufacturing, testing, and maintaining meter encoding registers made in accordance with prior art procedures.

SUMMARY OF THE INVENTION

In accordance with the principles of the present invention there is provided a multiple shaft meter encoding register including apparatus for accurately realigning the register shafts to a predetermined position following manufacture and test. The register includes a frame and a plurality of shafts rotatably mounted in the frame. Means are provided for generating electrical signals responsive to the angular position of the shafts. Furthermore, means are provided for interconnecting the shafts with a rotatable metering movement to concurrently rotate the shafts at different predetermined rates of rotation in response to actuation by the metering movement. The register also includes clutch means for releasing any of the shafts from the interconnecting means, whereby the shafts may be individually rotated independently of each other. The apparatus also includes a reference alignment member operable between a first position and a second position with respect to the frame. A plurality of shaft alignment members are provided, each being mounted upon a separate one of the shafts in fixed angular relationship thereto, such that rotation of the shafts when the reference alignment member is in the second position is operable to cause engagement between the shaft alignment members and the reference alignment member at a predetermined angular position of the shafts, such that the electrical signal generating means produces a predetermined electrical signal.

Since the alignnment procedure is accomplished using mechanical means, there are no electrical reading or settling time restrictions. Furthermore, an alignment procedure incorporating the disclosed apparatus requires no special operator skill and permits easy confirmation of interdial alignment. The apparatus reduces test and alignment time of the register and permits easy alignment in the field without costly alignment equipment or access to a source of electrical power.

DESCRIPTION OF THE PREFERRED EMBODIMENT

Figure 1:
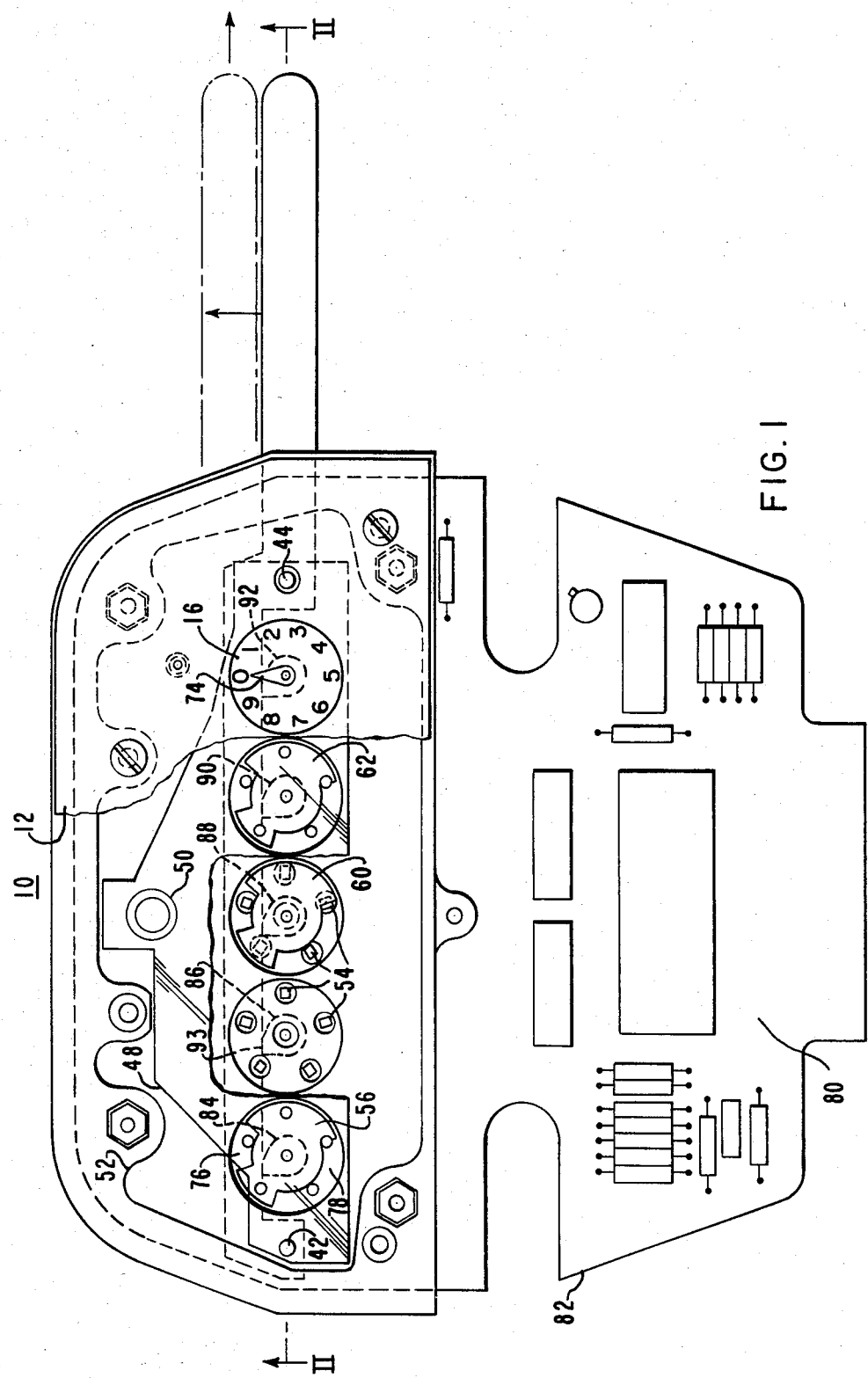
FIG. 1 is a front plan view with parts broken away of a meter encoding register assembly made in accordance with the present invention.

Referring now to the drawings and more particularly to FIG. 1, there is shown a front plan view with parts broken away of a multiple dial meter encoding register assembly 10 made in accordance with the principles of the present invention. The meter encoding register 10 is an optoelectronic type substantially as disclosed in the aforementioned U.S. Pat. No. 4,037,219, with the additional improvements of the invention as disclosed herein. The register 10 generally includes a front dial plate 12 having five decade-related dials, the units dial 16 being shown at the righthand side of the dial plate 12. The dials indicate numerical meter readings of measured kilowatt-hours produced by the metering movement of a watthour meter. The metering movement is well known in the art and may be, for example, of the general type disclosed in the aforementioned U.S. patents. The metering movement, not shown, typically includes a shaft coupled to the register 10 and a disk electromagnetically driven by magnetic fluxes produced by voltage and current through the circuit being monitored. The metering movement applies rotational input to the register assembly 10 through the input gear 18, shown in FIG. 2. Circularly disosed numerals "0" through "9" define each of the dials on the dial plate 12. The dials are progressively ascending in the clockwise direction on alternate dials, beginning with the righthand units dial. The two remaining dials are progressively ascending in the counterclockwise direction, as described in the aforementioned U.S. Pat. No. 4,037,219.

Figure 2:
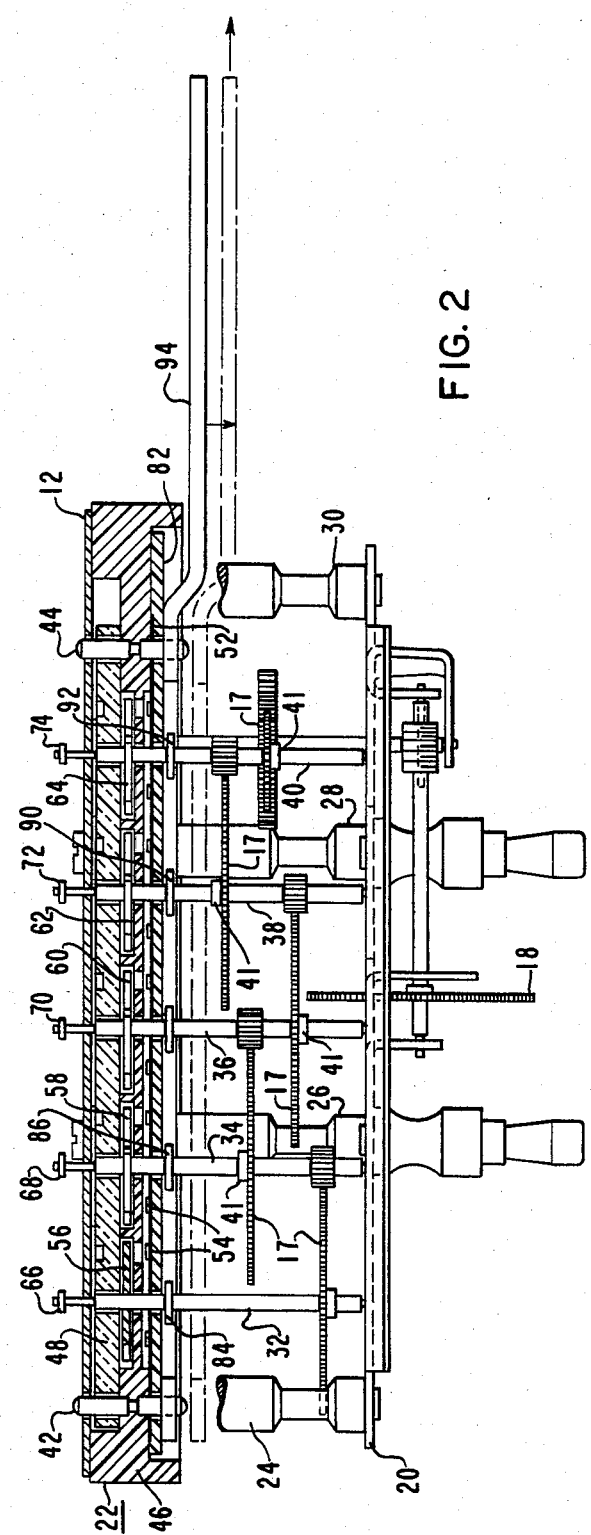
FIG. 2 is a bottom plan view, partially in section, of the register assembly shown in FIG. 1.

As can be seen in FIGS. 1 and 2, the register assembly 10 includes a support structure, or frame comprising a backplate 20 and an encoder assembly 22 joined by support posts 24, 26, 28, and 30.

The register assembly 10 also includes five pointer shafts 32, 34, 36, 38, and 40 which extends through the encoder assembly 22 and are journaled into the backplate 20 and a dial plate 12. The pointer shafts 32-40 extend in parallel relationship to each other and are oriented so as to extend through the center axis of each of five register dials, one of which 16 is shown in FIG. 1. The shafts 32-40 are interconnected by a train of gears 17 which, when driven through the input gear 18 by the metering movement produces simultaneous rotation of the five pointer shafts 32-40 in a decade relationship. As can be seen in the Figures, locating pins 42 and 44 are mounted in the encoder assembly 22 to accurately position the dial plate 12 and a reference alignment member, to be more completely described hereinafter. The gear train is well known in the art and is described, for example, in the aforementioned U.S. patents.

The encoder assembly 22, described more completely in U.S. Pat. No. 4,342,908, includes a frame member 46 through which extend the five pointer shafts 32-40. Directly behind the dial plate 12 is a light plate 48 of transparent plastic material which distributes light from a light source 50 to provide a plurality of parallel illumination sources shining in a direction perpendicular to the plane of light plate 48 and dial plate 12. As is described in the aforementioned U.S. Pat. No. 4,342,908, a photocell array 52 is provided which includes 5 circular groups of photocells 54 concentrically disposed around each of the pointer shafts 32-40. Interposed between the array 52 and the light plate 48 are five code members, or wheels, 56, 58, 60, 62, and 64, each of which is fixedly attached to a corresponding pointer shaft 32-40. The code wheels 56-64 are disposed in fixed angular relationship to the shafts 32-40 and corresponding dial pointers 66, 68, 70, 72, and 74. As can be seen in FIG. 1, the code wheels have cut-out portions 76 and 78 such that rotation of the pointer shafts is operable to rotate the respective code wheels and alternately transmit and block light rays from the light plate 48 to the photocells 54. As can be seen in FIGS. 1 and 2, the code wheels and photocells are effectively baffled by the frame member 46 to provide efficient operation of the encoder with relatively low levels of illumination from the source 50 and prevent interference from ambient illumination.

In a manner more completely described in the aforementioned U.S. Pat. No. 4,037,219, rotation of the pointer shafts to produce alternate conditions of illumination and darkness upon the photocells is operable to provide electrical signals indicative of the angular position of the pointer shafts 32-40. These signals are detected by electronic circuitry 80 mounted upon a printed circuit board 82 directly behind the photocell array 52. The circuitry 80 interprets the changing electrical signals from the photocells 54 to produce a coded signal representative of the angular positions of the shafts, which in turn provides an electronic signal coded with the amount of electrical energy consumed by the circuit connected to the associated metering movement. The output of the electronic circuitry is thus directly representative of the reading produced by the dial pointers 66-74.

As part of the manufacturing process, the register 10 is subjected to numerous testing procedures which result in the shafts 32-40 and associated pointers and code wheels being displaced from their zero position. Prior to shipment, it is necessary that the shafts be realigned to the zero position. This realignment, or zeroing procedure presented considerable difficulties in the past, some of which were alleviated by the aforementioned U.S. Pat. No. 4,072,267 which provided clutch assemblies 41 on each of the shafts 32-40, whereby the shafts could be rotated independently of the rest of the interconnecting gear train by the application of a torque above a predetermined value to the shaft. In this manner, it was not necessary to rotate the lower decade shafts through the multiplicity of rotations in order to move the higher decade shafts through a much smaller movement, as was required in registers prior to the aforementioned U.S. Pat. No. 4,072,267.

In registers using the code system disclosed in the aforementioned U.S. Pat. No. 4,037,219, which have five photocells spaced in equiangular positions around each of the shafts 32-40, the electrical reading produced by each group of five photocells will change upon a shaft rotation of 18 degrees. However, proper interdial alignment required less than 9 degrees alignment error. The procedure used for interdial alignment called for the operator to set the dial to a transition point between two electrical readings such that gear backlash in the register would allow the reading to oscillate between the two electrical readings on either side of the transition point. Since gear backlash was generally less than a few degrees, this procedure permitted alignment well within the 9 degree maximum allowable error.

Although the foregoing procedure was effective in producing interdial alignment following manufacturing test operations, it was impossible to recheck the alignment on a completed register without going through the entire alignment procedure again. Furthermore, the procedure was time consuming, since the operator had to wait at least one-half second between electrical readings to allow for reading and "settling" time. Thus, several minutes were required for alignment of each register, producing a considerable labor cost in high volume production.

Figure 3:
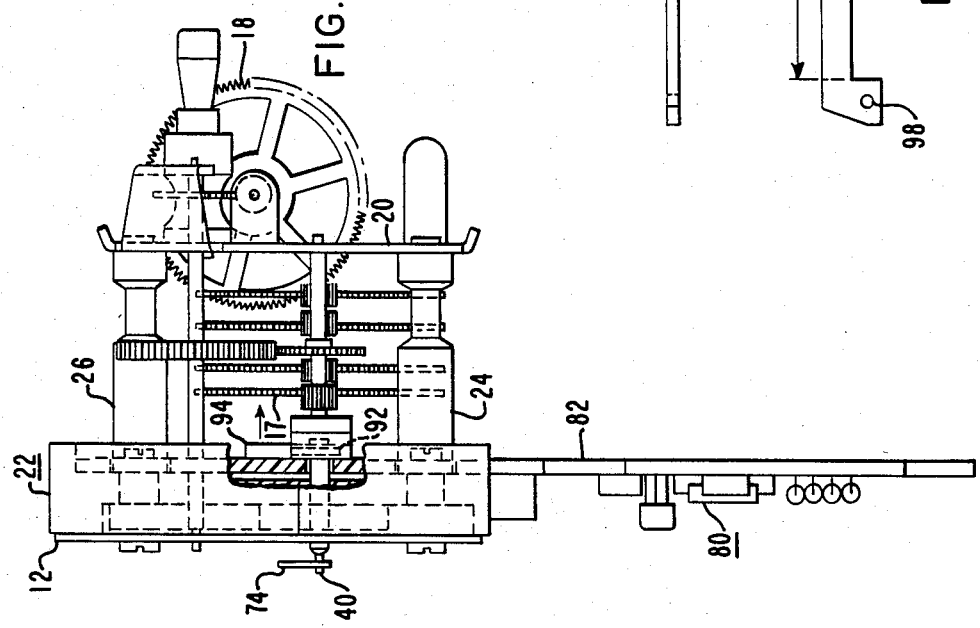
FIG. 3 is a right side plan view of the register assembly shown in FIGS. 1 and 2.
Figure 5:
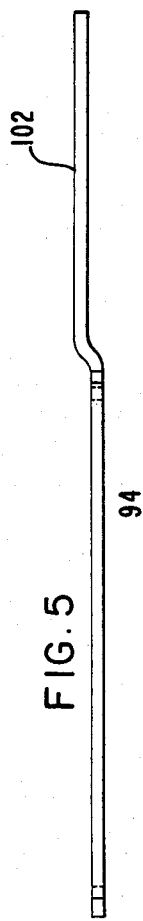
FIG. 5 is a top plan view of the reference alignment member shown in FIG. 4.
Figure 4:
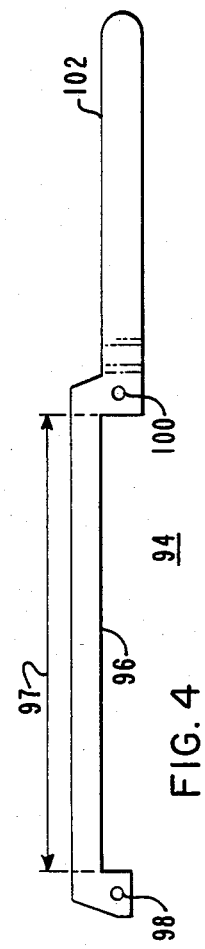
FIG. 4 is a front plan view of a reference alignment member used to provide interdial alignment of the register assembly shown in FIGS. 1 through 3.

In accordance with the present invention, interdial alignment procedures are considerably facilitated by the inclusion of a plurality of shaft alignment members, or cams, 84, 86, 88, 90, and 92, with one cam being attached in fixed angular relationship to each shaft. As can be seen in FIGS. 1 through 3, the cams each have a cam surface 93 and are preferably mounted directly behind the printed circuit board 82 and ahead of each of the gears 17 on each of the shafts 32-40. The invention further provides reference alignment member, or tool, which is movable between a first position out of engagement with the interconnecting train of gears 17 and a second position in a predetermined relationship with the frame 46. In a preferred embodiment, the reference alignment member comprises the removable tool 94 as shown in FIGS. 4 and 5. The tool 94 is an elongated planar member having an engagement surface 96 disposed between two positioning members or holes 98 and 100. The surface 96 has a major dimension 97 parallel to a line connecting the holes 98 and 100. As can be seen in FIG. 5, the tool 94 also includes an offset handle portion 102, permitting the placement of the alignment tool 94 to the rear of the encoder assembly directly against the rear surface thereof with the holes 98 and 100 positioned over the alignment pins 42 and 44. The offset of the handle portion 102 provides clearance with the edge of the encoder assembly 22, permitting the alignment portion of the tool 94 to be firmly positioned against the rear surface of the circuit board 82.

In order to perform an alignment procedure placing all of the shafts 32-40 in their zero position, the tool 94 is moved to its second position, with the positioning holes 98 and 100 engaging the alignment pins 42 and 44 and the dimension 97 perpendicular to the shafts 32-40, as shown in solid lines in FIG. 2. Each of the shafts 32-40 is then subjected to a rotational torque above the predetermined limit to individually rotate the shaft until the cam surface 93 of the respective cam 84-92 is rotated into contact with the engagement surface 96 of the alignment tool 94. This procedure is followed for each of the shafts 32-40, thereby quickly and efficiently providing the required degree of interdial alignment. Since the cams are separate from the code wheels, the encoder light path remains isolated from ambient illumination.

Other variations are possible. For example, the alignment tool could be manufactured as an integral part of the register assembly 10, with a hinge, or other arrangement, to permit the alignment tool to be operated between first and second positions, which are out of and into engagement, respectively, with the cams 84-92.

In a second alternative embodiment, the cams could be removably positioned in fixed angular relationship upon the shafts 32-40 to the front of the dial plate 12. Following alignment, the cams could then be removed. However, this procedure would eliminate the advantage of being able to perform a fast and efficient realignment of the shafts in the field.

As can be seen, the invention provides a method and apparatus for performing fast and efficient interdial alignment of a multishaft meter encoding register. The use of a reference alignment surface with the major dimension perpendicular to the shafts permits the use of a simple one-piece alignment tool to align all shafts of the multishaft register. Since the procedure is purely mechanical, there are no electrical reading and settling time restriction. Furthermore, the procedure requires no special operator skill and may be easily incorporated into existing register designs. The interdial alignment is readily confirmed without any additional alignment procedures. It is to be understood that while a preferred embodiment and several alternative embodiments of the present invention have been disclosed herein other modifications and embodiments may be made within the spirit and scope of this invention.

What we claim is:

1. A multiple shaft meter encoding register for a utility meter having a metering movement responsive to a metered quantity, comprising:

a frame;

a plurality of shafts rotatably mounted in said frame;

means for generating electrical signals responsive to the angular position of said shafts, said generating means comprising a plurality of code members each fixedly mounted to a separate one of said shafts;

means for interconnecting said shafts with the associated metering movement for concurrently rotating said shafts at different predetermined rates in response to actuation by the associated metering movement;

means for releasing any of said shafts from said interconnecting means, said shafts being individually rotatable independently of each other;

a reference alignment member operable between a first position and a second position with respect to said frame, said reference alignment member being separable from said frame; and a plurality of shaft alignment members separate from said code members each mounted in a predetermined angular relationship upon a separate one of said shafts such that rotation of said shafts when said reference alignment member is in said second position is operable to cause engagement of said reference and shaft alignment members at a predetermined angular position of said shafts.

2. An encoding register as recited in claim 1 wherein said reference alignment member is removable from said register.

3. An encoding register as recited in claim 2 wherein said frame comprises first means locating said reference alignment member, said reference alignment member including a second means for locating said reference alignment member, said first and second locating means engaging each other when said reference alignment member is in said second position.

4. An encoding register as recited in claim 1 wherein said electrical signal generating means comprises an illumination source and a plurality of photocells, each of said code members alternately transmitting and blocking illumination between said illumination source and said photocells in response to rotation of said shafts.

5. An encoding register as recited in claim 4 wherein each of said shaft alignment members comprises a cam member having a cam surface, said reference alignment member comprising an engagement surface, said cam surfaces being movable into contact with said engagement surface upon rotation of said shafts to said predetermined angular position.

6. An encoding register as recited in claim 5 wherein said cams are fixedly attached to said shafts.

7. An encoding register as recited in claim 1 wherein each of said shaft alignment members comprises a cam member having a cam surface, said cam surfaces being movable into contact with an engagement surface of said reference alignment member by rotation of said shafts to said predetermined angular position.

8. An encoding register as recited in claim 1 wherein said interconnecting means comprises a plurality of gears.

9. A multiple shaft meter encoding register for a utility meter having a metering movement responsive to a metered quantity, comprising:
a frame;
a plurality of shafts rotatably mounted in said frame;
means for generating electrical signals responsive to the angular position of said shafts;
means for interconnecting said shafts with the associated metering movement for concurrently rotating said shafts at different predetermined rates in response to actuation by the associated metering movement;
means for releasing any of said shafts from said interconnectng means, each of said shafts being individually rotatable;
a reference alignment member operable between a first position and a second position with respect to said frame, said reference alignment member having an engagement surface with a major dimension extending perpendicular to said shafts when said reference alignment member is in said second position, said reference alignment member being separable from said frame; and
a plurality of shaft alignment members each mounted in a predetermined angular relationship upon a separate one of said shafts such that rotation of said shafts when said reference alignment member is in said second position is operable to cause engagement of said engagement surface with each of said shaft alignment members at a predetermined angular position of each of said shafts.

10. An encoding register as recited in claim 9 wherein said reference alignment member is removable from said register.

11. An encoding register as recited in claim 10 wherein said frame comprises first means for locating said reference alignment member, and said reference alignment member comprising second means for locating said reference alignment member, said first and second locating means engaging each other when said reference alignment member is in said second position.

12. An encoding register as recited in claim 11 wherein said electrical signal generating means comprises an illumination source, a plurality of photocells, and a plurality of code members, each of said code members being fixedly mounted to a separate one of said shafts and alternately transmitting and blocking illumination between said illumination source and said photocells in response to rotation of said shafts.

13. An encoding register as recited in claim 12 wherein each of said shaft alignment members comprises a cam member having a cam surface.

14. An encoding register as recited in claim 13 wherein said cams are fixedly attached to said shafts.

15. An encoding register as recited in claim 9 wherein each of said shaft alignment members comprises a cam member having a cam surface, rotation of said shafts to said predetermined angular position causing said cam surfaces to come into contact with said engagement surface.

16. An encoding register as recited in claim 9 wherein said interconnecting means comprises a plurality of gears.

17. In a meter encoding register having multiple shafts mounted in a frame and concurrently rotatable at different predetermined rates in response to actuation by a metering movement, a plurality of code members each fixedly mounted to a separate one of said shafts for generating electrical signals responsive to the angular position of said shafts, and means for selectively allowing independent rotation of said shafts, a method for aligning said shafts to a predetermined angular position, said method comprising the steps of: 'mounting a separate shaft alignment member to each of said shafts separate from said code members with a predetermined angular relationship between said code members and said shaft alignment members;
positioning a reference alignment member upon said frame in a predetermined relationship therewith;
individually rotating each of said shafts such that the corresponding shaft alignment member engages said reference alignment member, whereby each of said shafts becomes aligned to a predetermined angular position;
repositioning said reference alignment member such that said reference alignment member is no longer in engagement with said shaft alignment members; and
removing said reference alignment member from said frame.

18. A method as recited in claim 17 comprising the additional step of removing said shaft alignment member.

19. A method as recited in claim 17 wherein said frame comprises a first locating member fixedly attached thereto, said reference alignment member comprising a second locating member, and the step of positioning said reference alignment member comprises engaging said first locating member with said second locating member.

20. A method as recited in claim 19 wherein said first locating member comprises a plurality of pins and said second locating member comprises a plurality of apertures, and the step of positioning said reference alignment member comprises placing said reference alignment member upon said frame such that said pins extend into said apertures.

21. A multiple shaft meter encoding register for a utility meter having a metering movement responsive to a metered quantity, comprising:
 a frame;
 a plurality of shafts rotatably mounted in said frame;
 means for generating electrical signals responsive to the angular position of said shafts, said generating means comprising a plurality of code members each fixedly mounted to a separate one of said shafts;
 means for interconnecting said shafts with the associated metering movement for concurrently rotating said shafts at different predetermined rates in response to actuation by the associated metering movement;
 means for releasing any of said shafts from said interconnecting means;
 a plurality of shaft alignment members, each of said plurality of shaft alignment members being connected to a preselected one of said plurality of shafts in a predetermined angular relationship, each of said shaft alignment members having a fixed angular relationship to the one of said plurality of code members that is fixedly mounted to the same shaft; and
 each of said plurality of shaft alignment members comprises a cam surface, said cam surface being shaped to align with a reference alignment member, said reference alignment member being operable between a first position and a second position with respect to said frame, said reference alignment member being separable from said frame.

22. In a meter encoding register having multiple shafts mounted in a frame and concurrently rotatable at different predetermined rates in response to actuation by a metering movement, and means for selectively allowing independent rotation of said shafts, a method for aligning said shafts to a predetermined angular position, said method comprising the steps of:
 mounting a separate shaft alignment member to each of said shafts with a predetermined angular relationship between said shafts and said shaft alignment members;
 positioning a reference alignment member having an engagement surface upon said frame in a predetermined relationship therewith such that said engagement surface is perpendicular to said shafts;
 individually rotating each of said shafts such that the corresponding shaft alignment member engages said engagement surface member, removing said reference alignment member from said frame.

23. A method as recited in claim 22 comprising the additional step of removing said shaft alignment member.

24. A method as recited in claim 22 wherein said frame comprises a first locating member fixedly attached thereto, said reference alignment member comprising a second locating member, and the step of positioning said reference alignment member comprises engaging said first locating member with said second locating member.

25. A method as recited in claim 24 wherein said first locating member comprises a plurality of pins and said second locating member comprises a plurality of apertures, and the step of positioning said reference alignment member comprises placing said reference alignment member upon said frame such that said pins extend into said apertures.

* * * * *